United States Patent [19]
Cheng et al.

[11] Patent Number: 5,624,867
[45] Date of Patent: Apr. 29, 1997

[54] LOW TEMPERATURE FORMATION OF PALLADIUM SILICIDED SHALLOW JUNCTIONS USING IMPLANT THROUGH METAL/SILICIDE TECHNOLOGY

[75] Inventors: Huang-Chung Cheng, Hsinchu; Cheng-Tung Lin, Taichung; Pei-Fen Chou, Chiayih, all of Taiwan

[73] Assignee: National Science Council, Taipei, Taiwan

[21] Appl. No.: 448,670

[22] Filed: May 24, 1995

[51] Int. Cl.$^6$ .................... H01L 21/225; H01L 21/283
[52] U.S. Cl. .................... 438/560; 438/533; 438/682; 438/659
[58] Field of Search ....................... 437/200, 201, 437/160, 161, 162, 20, 25

[56] References Cited

U.S. PATENT DOCUMENTS

| | | | |
|---|---|---|---|
| 5,010,037 | 4/1991 | Lin et al. | 437/200 |
| 5,162,263 | 11/1992 | Kunishima et al. | 437/200 |
| 5,217,923 | 6/1993 | Suguro | 437/200 |
| 5,217,924 | 6/1993 | Rodder et al. | 437/200 |
| 5,268,317 | 12/1993 | Schwalke et al. | 437/41 |

OTHER PUBLICATIONS

Lin, C.T., et al., "Low Temperature formation of Shallow p$^+$n Junctions . . . ," J. Electrochem. Soc., vol. 142, No. 5, May 1995, pp. 1579–1584.

Yamada, K., et al., "Formation of Metal silicide–silicon . . . ," Appl. Phys. Lett., vol. 64, No. 25, 20 Jun. 1994, pp. 3449–3351.

Kang, S., et al., "Effects of amorphous silicon capping . . . ," Appl. Phys. Lett., vol. 54, No. 8, 20 Feb. 1989, pp. 693–695.

Primary Examiner—T. N. Quach
Attorney, Agent, or Firm—Fish & Richardson P.C.

[57] ABSTRACT

A low temperature process for forming palladium silicided shallow junctions in which ions are implanted into a palladium or a palladium silicide layer over a silicon substrate. The impurities are driven into the silicon substrate during the formation or recrystallization of the palladium silicide layer, and a diffusion region with shallow junction is formed in the substrate.

20 Claims, 7 Drawing Sheets

LOW TEMPERATURE FORMATION OF PALLADIUM SILICIDED SHALLOW JUNCTIONS USING IMPLANT THROUGH METAL/SILICIDE TECHNOLOGY

BACKGROUND OF THE INVENTION

This invention relates to the processing of semiconductor devices, and more specifically, to a low temperature formation of palladium silicided shallow junctions using implant through metal/silicide technology.

The short channel effect has become a dominant constraint in the development of high density semiconductor integrated circuits (ICs). In order to suppress the short channel effect, a shallow junction structure is utilized in place of conventional junction structures in semiconductor devices of high density ICs. A semiconductor device with the shallow junction structure can operate normally as its channel length decreases to a critical dimension, thus improving the performance of high density ICs.

However, since P-type impurities, such as boron ions, have a higher diffusion coefficient, heavily doped P-type diffusion regions in a N-type silicon substrate are not easily controlled. That is, it is difficult to keep the $P^+$-N junction depth in a small range. Moreover, a conventional method for forming a junction is carried out by implanting ions directly into the silicon substrate. The requisite high-temperature annealing process for this enhances the diffusion of the impurities in the substrate, thus failing to form the shallow junction.

One solution to the above mentioned problems is to implant boron ions into the silicon substrate using a low energy ion implanter. The low energy ion implanter implants ions at a low implanting energy of 1–2 KeV, or even as low as 200–500 eV. However, though shallow junctions can be formed through the low implanting energy, the manufacturing costs are increased due to the introduction of the special implanter. Furthermore, because the diffusion regions formed by the low-energy ion implantation has a high sheet resistance, this method can not be applied in the fabrication of high density ICs.

Another solution is to implant silicon or germanium ions into the silicon substrate, thus forming an amorphous surface thereon. The amorphous surface can prevent the diffusion of boron ions due to the elimination of the channel effect. However, a very high temperature annealing process is necessary for the recrystallization of the damaged substrate surface. The high temperature process does not conform to the requirements for fabricating the high density ICs. Furthermore, in order to have an acceptable surface properties, the process conditions must be strictly controlled. Therefore, this method is not suitable for the semiconductor industry.

SUMMARY OF THE INVENTION

The invention intends to provide a method for forming a shallow junction in a silicon substrate through a low temperature process, thus facilitating the fabrication of high-density integrated circuits.

The invention further intends to provide a method for forming a shallow junction in a silicon substrate through the formation of a silicide layer, thus improving the interconnection properties of the integrated circuits.

The invention also intends to provide a method for forming a shallow junction in a silicon substrate without implanting ions directly into the silicon substrate, thus preventing damage to the substrate surface.

These and other features or aspects of the present invention are achieved through a process in which ions are implanted into a palladium or a palladium silicide layer over a silicon substrate. The impurities are driven into the silicon substrate during the formation or recrystallization of the palladium silicide layer, and a diffusion region with shallow junction is formed in the substrate.

DETAILED DESCRIPTION OF THE INVENTION

Since palladium is more stable than titanium and other refractory metals, and its atomic number is large enough that it is difficult to diffuse in a silicon substrate, a palladium layer is utilized in the present application for an implantation barrier layer. Moreover, the amount of silicon consumption during the formation of palladium silicide is less than that of other metal silicides. Based on the above advantages, two embodiments of the present invention are described as follows.

Embodiment 1

FIG. 1A through FIG. 1D are cross-sectional views of the process steps of a first embodiment of the invention.

Figure 1A:
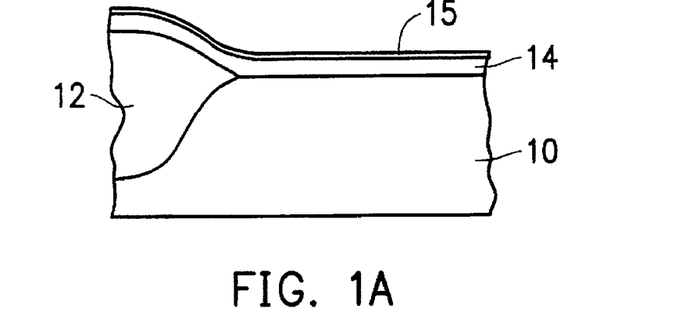
FIG. 1A through 1D illustrate, in cross section, the process steps according to a first embodiment of the invention.

Referring to FIG. 1A, a field oxide layer 12 is formed on an N-type silicon substrate 10 by, for example, local oxidation on silicon (LOCOS), to define an active region. The exposed substrate surface, i.e., the surface of the active region is processed by a predip step for removing a native oxide layer thereon. The predip step can be carried out by wet etching in a hydrofluoric acid (HF) solution. Then a palladium layer 14 is sputtered over the surface of the active region. Palladium layer 14 is sputtered to a thickness of about 500Å. In order to prevent contamination, a silicon layer 15 is deposited over palladium layer 14 by methods such as chemical vapor deposition (CVD).

Figure 1B:
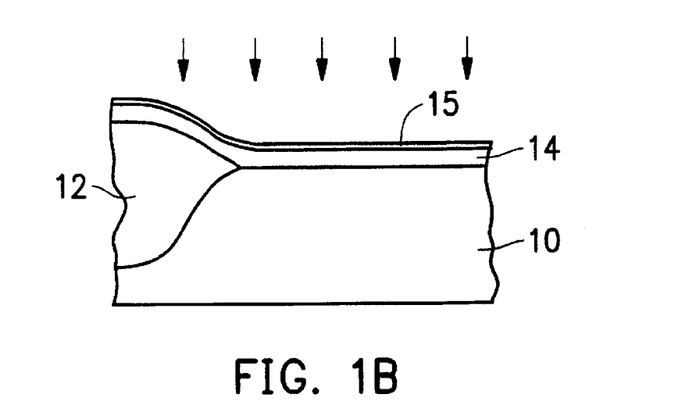

Next referring to FIG. 1B, an ion implantation step is performed. The ion implantation step can be carried out by implanting $BF_2^+$ ions into palladium layer 14 at an implanting energy of between 70 and 135 KeV with a dosage of about $5 \times 10^{15}$/cm2.

The structure of FIG. 1B is subjected to an annealing process to form a palladium silicide layer. In order to improve the properties of the palladium silicide layer, the annealing process is preferably carried out through a first annealing step, a selective etching step and a second annealing step.

Figure 1C:
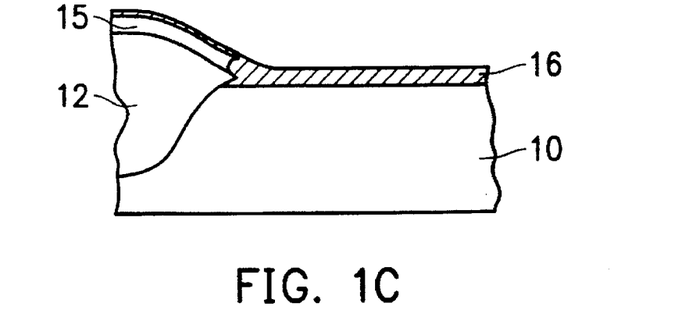

The first annealing step can be carried out in a nitrogen-containing conventional furnace at a temperature of about 300° C. for about 30 minutes. Referring to FIG. 1C, palladium silicide layer 16 is formed through the reaction of palladium layer 14 and silicon substrate 10 after the first annealing step. For only a thin silicide layer 19 lies above field oxide layer 12 due to the reaction of palladium layer 14 and silicon layer 15, a portion of palladium layer 17 is left thereon.

The selectively etching step is therefore performed to remove the unreacted palladium, such as palladium layer 17 of FIG. 1C. The etching step is carried out by, for example, a room temperature wet etching with a solution consisting of iodine(I2) and potassium iodide (KI).

The second annealing step is performed after the removing of unreacted palladium. The annealing step is preferably carried out in a nitrogen-containing furnace at a temperature of between 500° and 800° C. for about 60 minutes. A silicide layer 16 with lower resistance is formed through the second annealing step. Furthermore, referring to FIG. 1D, the impurities inside the palladium are driven into silicon substrate 10 to form a P-type diffusion region 18 after the annealing process.

Figure 1D:
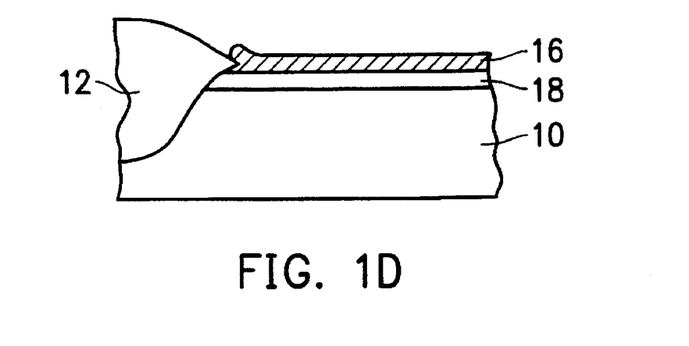

Therefore, the process for fabricating a device will be completed if a metal layer, such as an aluminum layer, is deposited and patterned to form a interconnection line over the structure of FIG. 1D. The manufacturing steps after the formation of the shallow junction are similar to those of conventional process and are well known to those skilled in the art.

Figure 3:
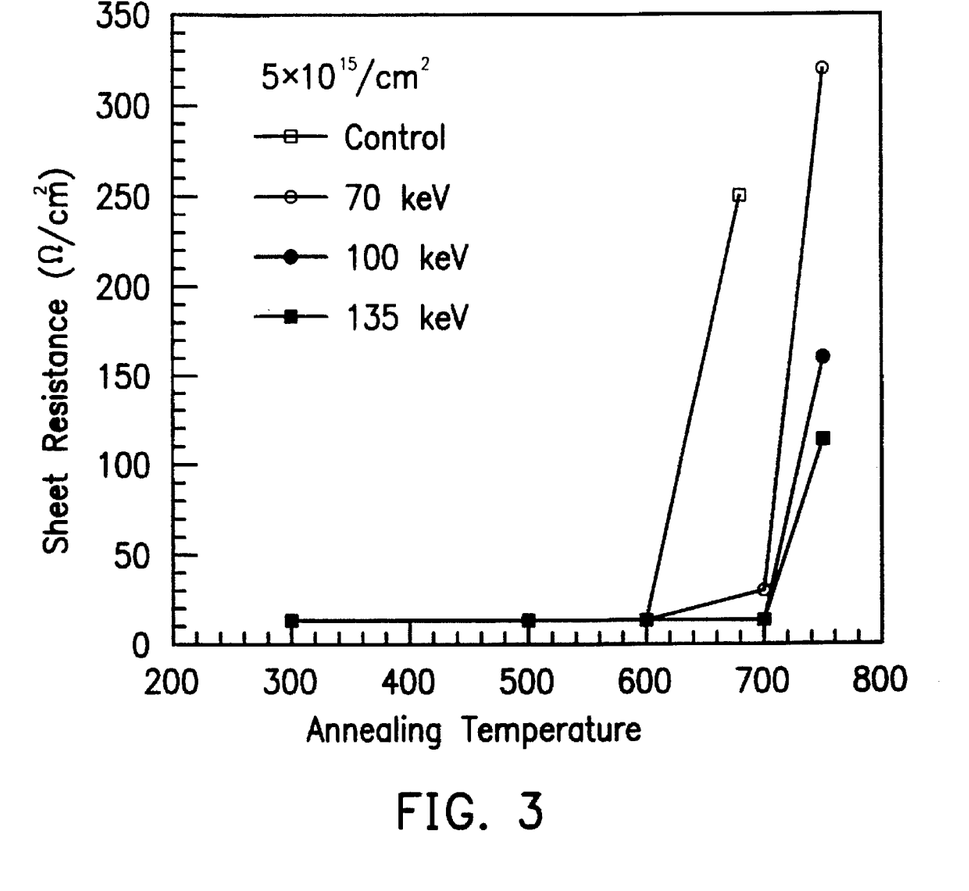
FIG. 3 illustrates the relationships between the sheet resistance of the palladium silicide layer and the annealing temperature for various implanting energies according to the first embodiment of the invention.

In order to verify the influence of the ion implantation step on the structure of FIG. 1D, three implanting conditions with various implanting energies are carried out. For example, ions are implanted into palladium layer 14 of FIG. 1B at energies of 70, 100 and 135 KeV. After the annealing step at various temperatures, the sheet resistances of palladium silicide layer 16 under the above three different implantation conditions are measured and illustrated in FIG. 3. Since the fluorine ions have an to important influence on the high temperature stability of the silicide layer, the sheet resistance of the silicide layers which are implanted at energies of 100 and 135 KeV are lower than that of 70 KeV due to deeper distributions of the fluorine ions in the former two conditions. A deep distribution of fluorine ions in the palladium layer provides more fluorine ions for the formation of silicide layer, thus increasing the stability of the silicide layer and decreasing the sheet resistance. The distribution of fluorine ions in the silicide layer and the silicon substrate for various ion implantation energies are listed in Table 1.

TABLE 1

| Implanting Energy (KeV) | Fluorine distribution (%) | | | |
|---|---|---|---|---|
| | Back scattering | 0–550 Å | 550–890 Å | >890 Å |
| 70 | 10.4 | 86.59 | 2.996 | 0.014 |
| 100 | 9.1 | 74.34 | 14.08 | 2.48 |
| 135 | 8.31 | 53.75 | 21.99 | 15.95 |

Figure 4:
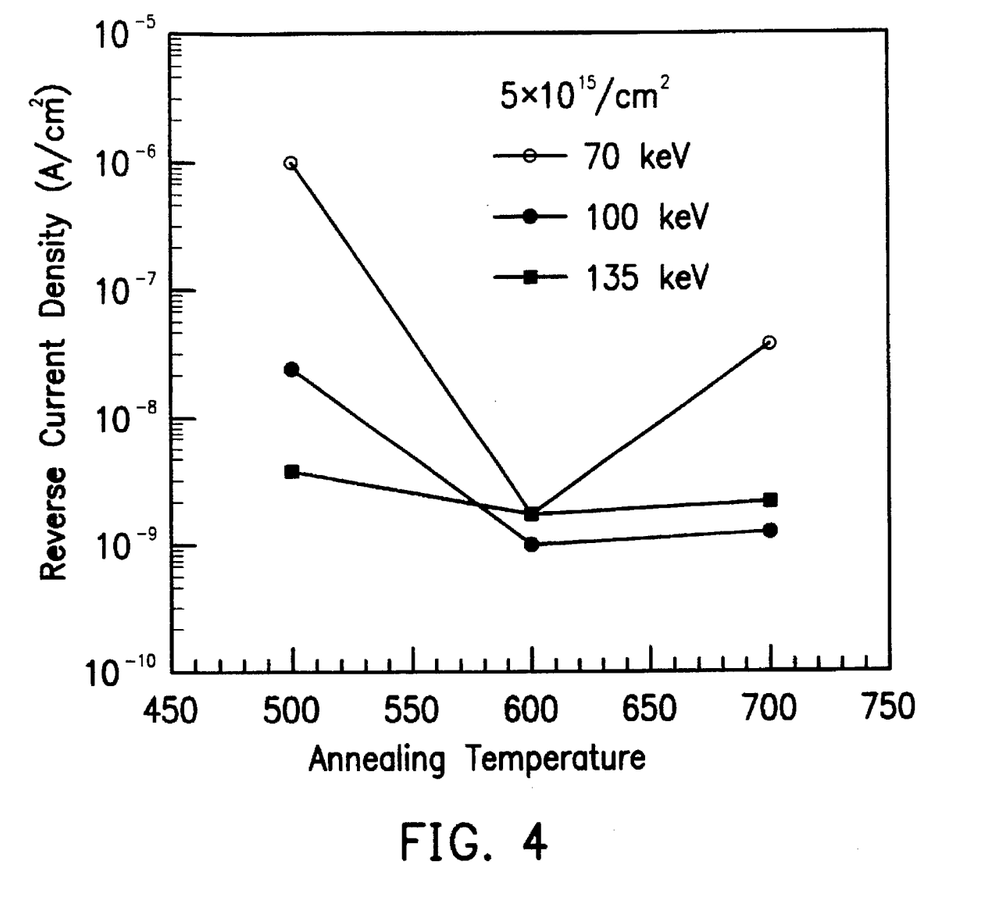
FIG. 4 illustrates the relationships between the leakage current density and the annealing temperature for various implanting energies according to the first embodiment of the invention.

The reverse current densities of the structure of FIG. 1D for various implanting energies and annealing temperatures are illustrated in FIG. 4. An analysis of FIG. 4 is explained as follows.

a. After annealing at a temperature of 600° C., the reverse current densities of all the three conditions are low enough to satisfy the requirement of a low leakage device. Therefore, shallow junction structures are recommended.

b. A low reverse current density is obtained after implanting at an energy of 135 KeV and annealing at 500° C. since there are enough impurities in the substrate after the higher energy implantation. Even though the high energy ion implantation may cause damage in the substrate, the 500° C. annealing process will recrystallize to eliminate the defects. Thus, a shallow junction with desirable quality can be obtained at a low annealing temperature of 500° C.

c. The structure which is implanted at an energy of 70 KeV has a high reverse current density after annealing at a temperature of 700° C. The high leakage current comes from island structures of the palladium silicide layer. As explained above, the shallow distribution of fluorine ions has a minor influence on the silicide layer, thus decreasing the stability of the silicide film.

The ideal factors of the shallow junction structures which are fabricated under the three ion implanting conditions are shown in Table 2. They all satisfy the requirements of a low leakage shallow junction device.

TABLE 2

| Implanting Energy (KeV) | Ideal Factor |
|---|---|
| 70 | 1.0312 |
| 100 | 1.0312 |
| 135 | 1.0439 |

Embodiment 2

FIG. 2A through FIG. 2D are cross-sectional views of the process steps of a second embodiment of the invention.

Figure 2A:
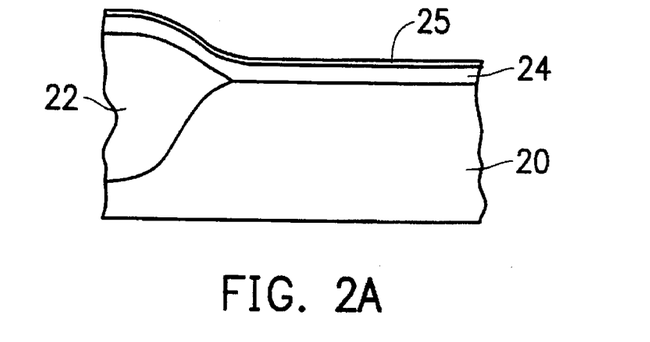
FIG. 2A through 2D illustrate, in cross section, the process steps according to a second embodiment of the invention.

Referring to FIG. 2A, the structure and process steps of the present embodiment are similar to that of the first embodiment which comprises an N-type silicon substrate 20 and a field oxide layer 22 for the definition of an active region. The surface of the active region is also processed by a predip step for removing a native oxide layer thereon. Then a palladium layer 24 is sputtered over the surface of the active region. Palladium layer 24 is sputtered to a thickness of about 500Å. A silicon layer 25 is deposited over palladium layer 24 to prevent contamination.

Figure 2B:
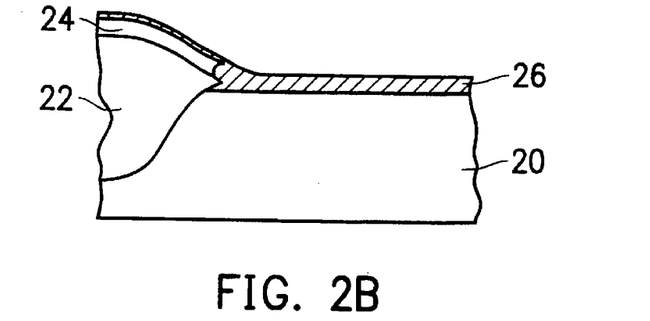

Next referring to FIG. 2B, the structure of FIG. 2A is subjected to an annealing process to form a palladium silicide layer. The annealing step can be carried out in a nitrogen-containing conventional furnace at a temperature of about 300° C. for about 30 minutes. As illustrated in the drawing, palladium silicide layer 26 is formed through the reaction of palladium layer 24 and silicon substrate 20 after the annealing step. Since only a thin silicide layer 29 lies above field oxide layer 22 due to the reaction of palladium layer 24 and silicon layer 25, a portion of palladium layer 27 is left thereon. Then a selective etching step is therefore performed to remove the unreacted palladium, such as palladium layer 27 of FIG. 2B.

Figure 2C:
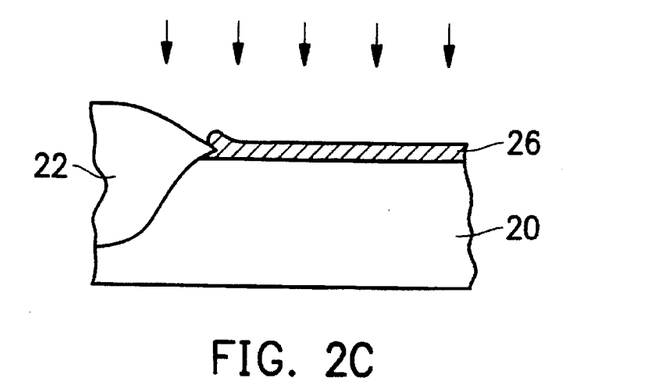

Next referring to FIG. 2C, an ion implantation step is performed. The ion implantation step can be carried out by implanting $BF_2^+$ ions into palladium silicide layer 26 at an implanting energy of between 40 and 120 KeV with a dosage of about $5 \times 10^{15}$/cm2.

A post-annealing step is performed after the ion implantation step. The post-annealing step is preferably carried out in a nitrogen-containing furnace at a temperature of between 500° and 750° C. for about 60 minutes. Silicide layer 26 will have a lower resistance after the second annealing step. Furthermore, referring to FIG. 2D, the impurities inside palladium silicide layer 26 are driven into silicon substrate 20 to form a P-type diffusion region 28 after the annealing process.

Figure 2D:
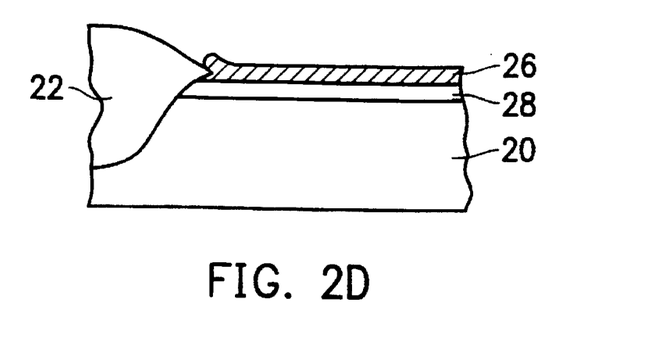

Therefore, the process for fabricating a device will be completed if a metal layer, such as a aluminum layer, is deposited and patterned to form a interconnection line over the structure of FIG. 2D. The manufacturing steps after the formation of the shallow junction are similar to those of the conventional process and are well known to those skilled in the art.

Figure 5:
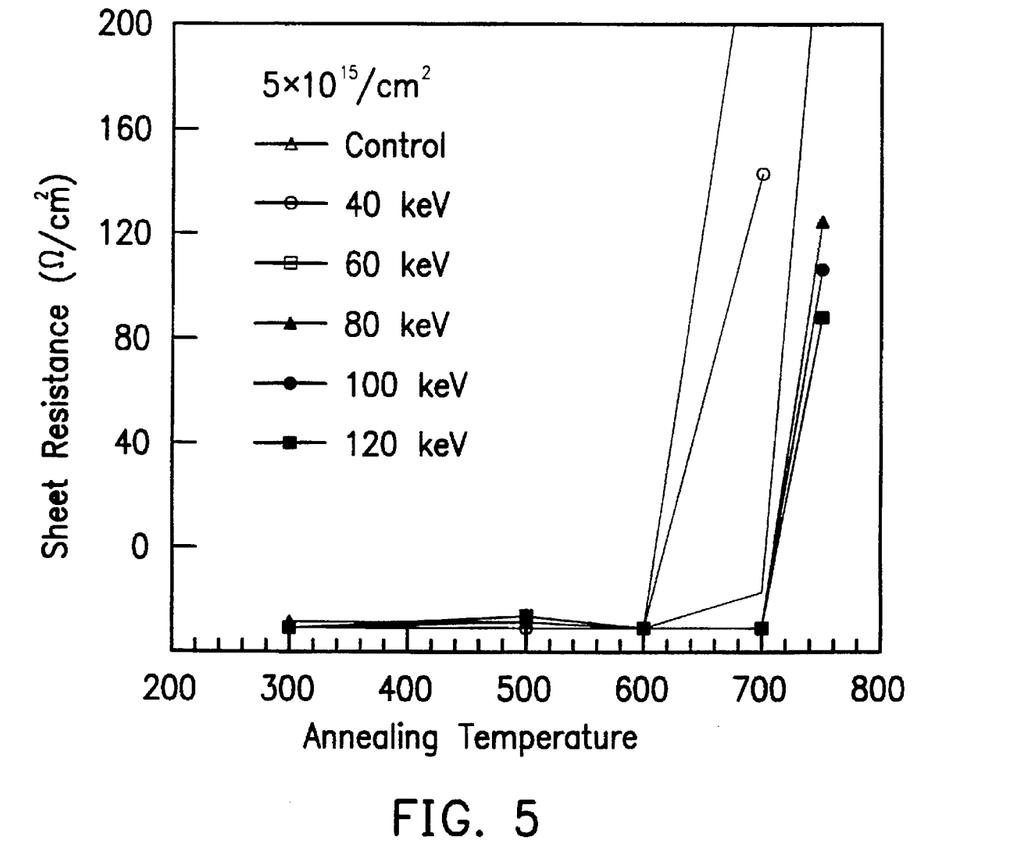
FIG. 5 illustrates the relationships between the sheet resistance of the palladium silicide layer and the annealing temperature for various implanting energies according to the second embodiment of the invention.
Figure 6:
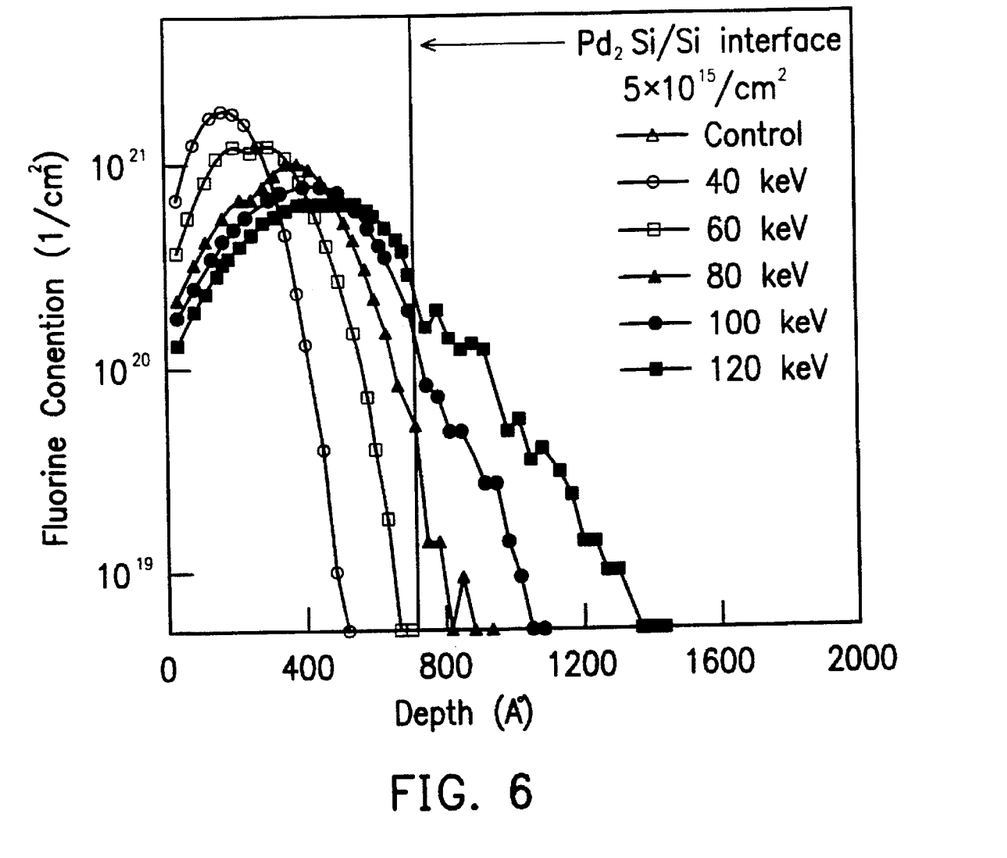
FIG. 6 illustrates the fluoride distribution in the palladium silicide layer and the silicon substrate according to the second embodiment of the invention.

In order to verify the influence of the ion implantation step on the structure of FIG. 2D, three implanting conditions with various implanting energies are carried out. For example, ions are implanted into palladium silicide layer 26 of FIG. 2C at energies of 40, 60, 80, 100 and 120 KeV. After the annealing step at various temperatures, the sheet resistances of palladium silicide layer 26 under the above three different implantation conditions are measured and illustrated in FIG. 5. Since the fluorine ions have an important influence on the high-temperature stability of the silicide layer, the sheet resistance of the silicide layer which is implanted at the energy of 120 KeV is lower than that of others due to a deeper distribution of the fluorine ions in this condition. The distributions of fluorine ions in the silicide layer and the substrate for various implanting energies are illustrated in FIG. 6. Obviously, a deep distribution of fluorine ions in the palladium silicide layer will increase the stability of the silicide layer and decrease the sheet resistance.

Figure 7:
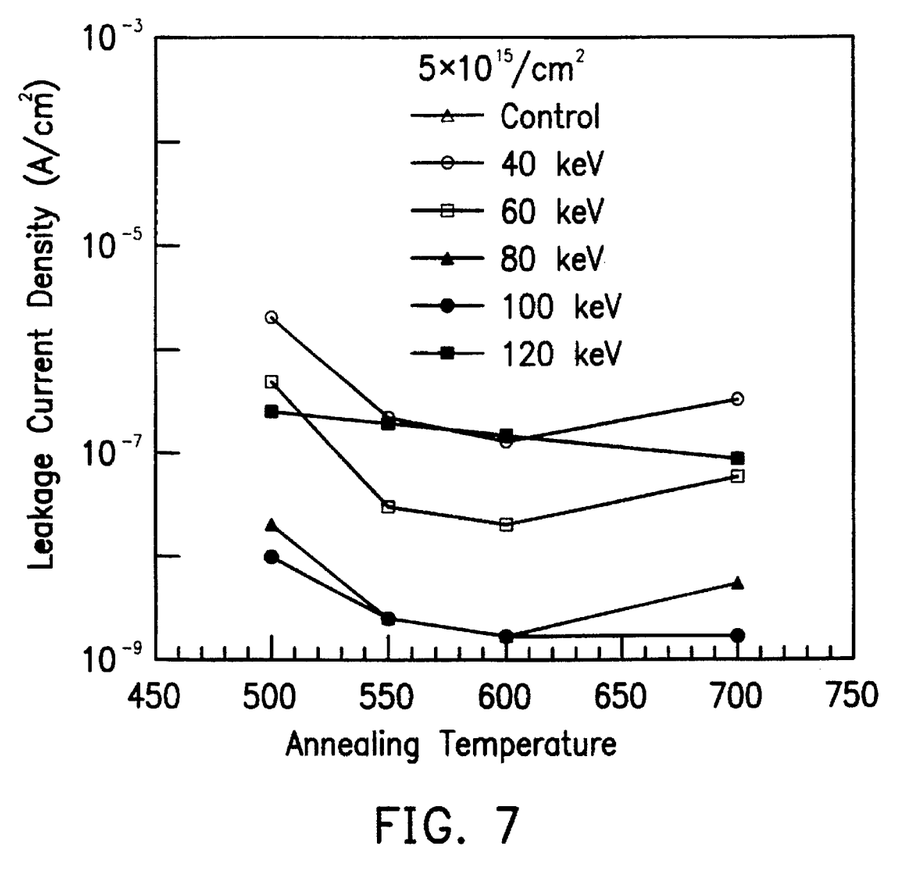
FIG. 7 illustrates the relationships between the leakage current density and the annealing temperature for various implanting energies according to the second embodiment of the invention.

The reverse current densities of the structure of FIG. 2D for various implanting energies and annealing temperatures are illustrated in FIG. 7. An analysis of FIG. 7 is also performed and explained as follows.

a. After annealing at a temperature of 550° C., the reverse current densities of the structures which are implanted at energies of 80 and 100 KeV have the lowest values. The structures implanted at energies of 40 and 60 KeV have higher leakage currents due to shallow distributions of the fluorine ions. The substrate of the structure which implanted at the energy of 120 KeV has too many defects to decrease the leakage current.

b. After a higher temperature annealing, the leakage currents of all the structures are increased. The reason is similar to that of the previous embodiment.

The ideal factors of the shallow junction structures which are fabricated under four various ion implanting conditions are shown in Table 3. They all satisfy the requirements of a low leakage shallow junction device.

TABLE 3

| Implanting Energy (KeV) | Ideal Factor |
| --- | --- |
| 40 | 1.0871 |
| 60 | 1.0375 |
| 80 | 1.0439 |
| 100 | 1.0504 |

Table 4 illustrates the junction depth resulting from various implantation energies and annealing temperatures. From the table, the six junction depth values all conform with the requirements of a shallow junction device.

TABLE 4

| Implanting Energy (KeV) | Junction depth (550° C.) (μm) | Junction depth (600° C.) (μm) |
| --- | --- | --- |
| 40 | 0.07 | 0.12 |
| 80 | 0.09 | 0.13 |
| 100 | 0.12 | 0.16 |

What is claimed is:

1. A method for forming a shallow junction in a region of a silicon substrate of a first conductivity type, comprising the steps of:

forming a palladium layer directly on said region of said silicon substrate;

forming a silicon layer over said palladium layer;

implanting impurities of a second conductivity type into said silicon and palladium layers;

pre-annealing said silicon substrate and said palladium layer so as to react all of said palladium layer over said region of said substrate to form a silicide layer, performing a selective etch step after said pre-annealing step; and post-annealing said silicon substrate and silicide layer to drive said impurities into said silicon substrate thereby forming said shallow junction.

2. The method of claim 1, wherein said pre-annealing step is carried out in a nitrogen-containing furnace at a temperature of about 300° C.

3. The method of claim 2, wherein said pre-annealing step is carried out for about 30 minutes.

4. The method of claim 1, wherein said post-annealing step is carried out in a nitrogen-containing furnace at a temperature of between 500° C. and 800° C. for about 60 minutes.

5. The method of claim 1, wherein said palladium layer has a thickness of about 500Å.

6. The method of claim 1, wherein said silicon layer has a thickness of about 50Å.

7. The method of claim 1, wherein said silicon substrate of first conductivity type is an N-type silicon substrate and said impurities of second conductivity type are P-type impurities.

8. The method of claim 7, wherein said implanting step is carried out by implanting $BF_2^+$ ions at an implanting energy of between 70 and 135 KeV and a dosage of about $5 \times 10^{15}$/cm$^2$.

9. The method of claim 1, wherein said selective etching step is carried out using a solution consisting of iodine and potassium iodide (KI).

10. The method of claim 1 further comprising the step of depositing an aluminum layer over said silicide layer as contact metallization.

11. A method for forming a shallow junction in a region of a silicon substrate of a first conductivity type, comprising the steps of:

forming a palladium layer directly on said region of said silicon substrate;

forming a silicon layer over said palladium layer;

pre-annealing said silicon substrate and said palladium layer so as to react all of said palladium layer over said region to form a silicide layer;

selectively etching unreacted palladium;

implanting impurities of a second conductivity type into said silicide layer, after said pre-annealing step; and post-annealing said silicide layer to drive said impurities into said silicon substrate thereby forming said shallow junction.

12. The method of claim 11, wherein said pre-annealing step is carried out in a nitrogen-containing furnace at a temperature of about 300° C.

13. The method of claim 12, wherein said pre-annealing step is carried out for about 30 minutes.

14. The method of claim 11, wherein said post-annealing step is carried out in a nitrogen-containing furnace at a temperature of between 500° and 800° C. for about 60 minutes.

15. The method of claim 11, wherein said palladium layer has a thickness of about 500Å.

16. The method of claim 11, wherein said silicon layer has a thickness of about 50Å.

17. The method of claim 11, wherein said silicon substrate of first conductivity type is an N-type silicon substrate and said impurities of second conductivity type are P-type impurities.

18. The method of claim 17, wherein said implanting step is carried out by implanting $BF_2^+$ ions at an implanting energy of between 40 and 120 KeV and a dosage of about $5 \times 10^{15}/cm^2$.

19. The method of claim 11, wherein said selectively etching step is carried out using a solution consisting of iodine and potassium iodide (KI).

20. The method of claim 11 further comprising the step of depositing an aluminum layer over said silicide layer as contact metallization.

* * * * *